United States Patent [19]

Menniti et al.

[11] 4,369,380

[45] Jan. 18, 1983

[54] CIRCUIT FOR CONTROLLING A TRANSISTOR STATIC SWITCH FOR D.C. LOADS WITH HIGH TURN-ON CURRENT

[75] Inventors: Pietro Menniti, Catanzaro; Maurizio Felici, Milan, both of Italy

[73] Assignee: SGS-ATES Componenti Elettronici S.p.A., Milan, Italy

[21] Appl. No.: 192,597

[22] Filed: Sep. 30, 1980

[30] Foreign Application Priority Data

Oct. 3, 1979 [IT] Italy ................................ 26205 A/79

[51] Int. Cl.³ .......................... H03K 3/26; H03K 3/33
[52] U.S. Cl. .................................. 307/254; 307/270; 307/300; 207/315
[58] Field of Search .................. 307/254, 297 R, 300, 307/315, 270

[56] References Cited

U.S. PATENT DOCUMENTS

| | | | |
|---|---|---|---|
| 3,633,051 | 1/1972 | Press | 307/297 |
| 3,636,381 | 1/1972 | Press | 307/296 |
| 3,671,833 | 6/1972 | Rakes | 307/315 |
| 3,978,350 | 8/1976 | Fletcher et al. | 307/315 |
| 4,189,651 | 2/1980 | Akamatsu | 307/315 |
| 4,227,099 | 10/1980 | Houkes | 307/315 |

*Primary Examiner*—Stanley D. Miller
*Assistant Examiner*—B. P. Davis
*Attorney, Agent, or Firm*—Wenderoth, Lind & Ponack

[57] ABSTRACT

A control circuit provides current to the bases of two transistors connected in a Darlington configuration. A load in series with the Darlington collector receives the turn-on current given the improved current gain of this configuration. A diode connected between the Darlington input transistors base and collector begins conduction as soon as the input transistor is saturated. The current applied directly to the base of the Darlington output transistor is enough to saturate the latter at the operating output load current. The invention permits the use of a Darlington switch, and allows the additional advantage of the low saturation voltage of a single transistor.

3 Claims, 2 Drawing Figures

CIRCUIT FOR CONTROLLING A TRANSISTOR STATIC SWITCH FOR D.C. LOADS WITH HIGH TURN-ON CURRENT

BACKGROUND OF THE INVENTION

This invention refers to static transistor switches for d.c. loads with high turn-on current, and, more specifically, to a control circuit for this type of switch.

We know that some electrical and electronic devices, such as incandescent lamps and induction motors, require a turn-on current that is much greater than the operating current. To connect a device of this type to a d.c. power source by means of a control signal issuing from a lower power signal generator, a switching transistor is customarily used said transistor, connected in series with the device itself and controlled at its base, either directly or indirectly, by the control signal. If the power of the control signal is insufficient to directly control the base of the transistor so as to produce switching from a cutoff state to a saturation state, one or more cascaded common-emitter transistors are connected before the switching transistor to amplify the power of the control signal. Obviously, since the current amplification requirements are different for turn-on and operating conditions, the control circuit must be designed for the turn-on conditions. This brings about a needless dissipation of energy during normal operating conditions. In many cases, a pair of transistors interconnected in the Darlington configuration are used in place of the switching transistor to eliminate this inconvenience. Although this solution eliminates all or part of the cascade amplifying transistors due to the improved current gain of the Darlington pair, and thus reduces dissipation in the control circuit, it provides a lesser degree of useful voltage on the load than that had by using a single switching transistor, assuming an equal supply voltage. In fact, we know that a Darlington pair has a much greater saturation voltage than the single transistor.

SUMMARY OF THE INVENTION

The object of this invention is a circuit to control a transistor static switch for d.c. loads with high turn-on current that uses two transistors connected in the Darlington configuration; has a voltage loss not greater than the saturation voltage of a single transistor; is economically feasible.

BRIEF DESCRIPTION OF THE DRAWINGS

This objective is attained, according to this invention, by the circuit characterized in the claims section which concludes this description and described in a non-limiting manner and by way of example as follows and with reference to the attached drawings where:

DESCRIPTION OF THE PREFERRED EMBODIMENT

Figure 1:
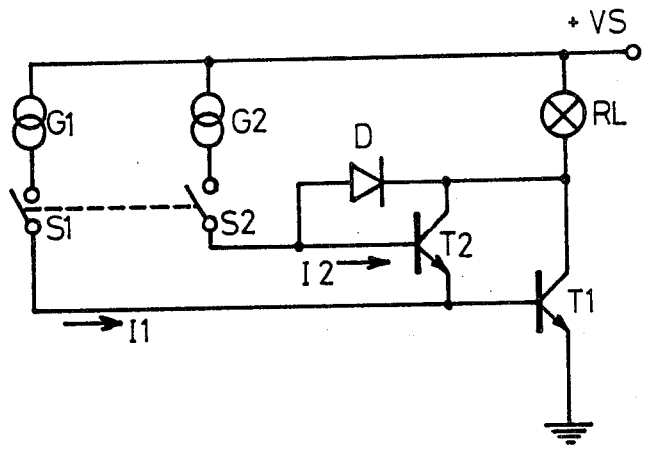
FIG. 1 is a theoretical circuit illustrating the concept of this invention.

Examining FIG. 1, we see a transistor T1 of the N-P-N type acting as a switch for an incandescent lamp RL connected between the collector of the transistor T1 and the positive pole +VS of a d.c. voltage source. The emitter of the transistor T1 is connected to the negative pole of the power source, indicated by the ground symbol in FIG. 1. A second transistor of the N-P-N type, indicated as T2, is connected to the transistor T1 in the Darlington configuration, i.e. with its collector and emitter connected, respectively, to the collector and base of T1. A diode D is inserted between the base and collector of T2 with the anode on the base. The T1 and T2 bases are each connected to a current generator, G1 and G2 respectively, by means of respective switches S1 and S2. The two switches S1 and S2 are mechanically coupled so as to open and close simultaneously.

As soon as the two S1 and S2 switches are closed, an $IB=I1+B2\cdot I2$ current flows through the base of T1, where B2 is the current gain of the transistor T2, and I1 and I2 represent the currents generated by G1 and G2, respectively. If B1 indicates the current gain of T1, a current of $IC=\beta 1\cdot IB=\beta 1(I1+2\cdot I2)$ passes through the load RL. With an appropriate selection of the G1 and G2 current generators and the T1 and T2 transistors, we can obtain an IC current that is is close enough to the typical turn-on current of the RL lamp to turn it on within an acceptable period.

Let us examine now the operation of the FIG. 1 circuit without the D diode. If T2 is not a special transistor-as will be specified further on in this text-it might operate as an inverted transistor, i.e. the collector and emitter terminals having reverse functions, when following saturation its base-collector junction is forward biased and the emitter voltage is greater than that of the collector. This can occur due to the presence of the I1 current, which tends to saturate T1, in the base of T1. The inverse gain of T2, although small, would tend to shunt current away from the base of T1, opposing its tendency to saturate. This inconvenience could obviously be avoided by using a negligible inverse gain transistor as the transistor T2. This, however, would not completely achieve the objective of this invention because a very-low inverse gain transistor is a rather costly item. The use of the diode D eliminates this inconvenience and utilizes a standard transistor in the T2 position.

It is clear that diode D is connected in such a manner as to be out when the T2 transistor operates in the active region of its characteristic curve. However, as soon as T2 reaches saturation, diode D becomes forward biased and thereby shunts the T2 base-collector junction, taking away from the latter its base control current and thus impeding "inverse" operation. It is important to note that this effect becomes more significant when the voltage across the forward biased diode D is lowered in comparison with the voltage drop across the forward biased base-collector junction of transistor T2. The choice of diode D is therefore a determining factor in the proper operation of the circuit.

When transistor T2 is cut-off, i.e. shunted by diode D, the current flowing through the base of T1 is $IB=I1$. The choice of generator G1 and transistor T1 is made so that it assures that the I1 current is enough to saturate T1 at an identical or slightly greater IC current than that of the operating load RL.

It can be seen that the circuit according to the invention does not dissipate unnecessary energy because it operates at maximum current only when necessary, i.e. during turn-on, it allows a minimum loss of voltage across the load because it is equal to the drop between the saturated transistor T1 emitter and collector, and lastly it does not require the use of costly components.

Figure 2:
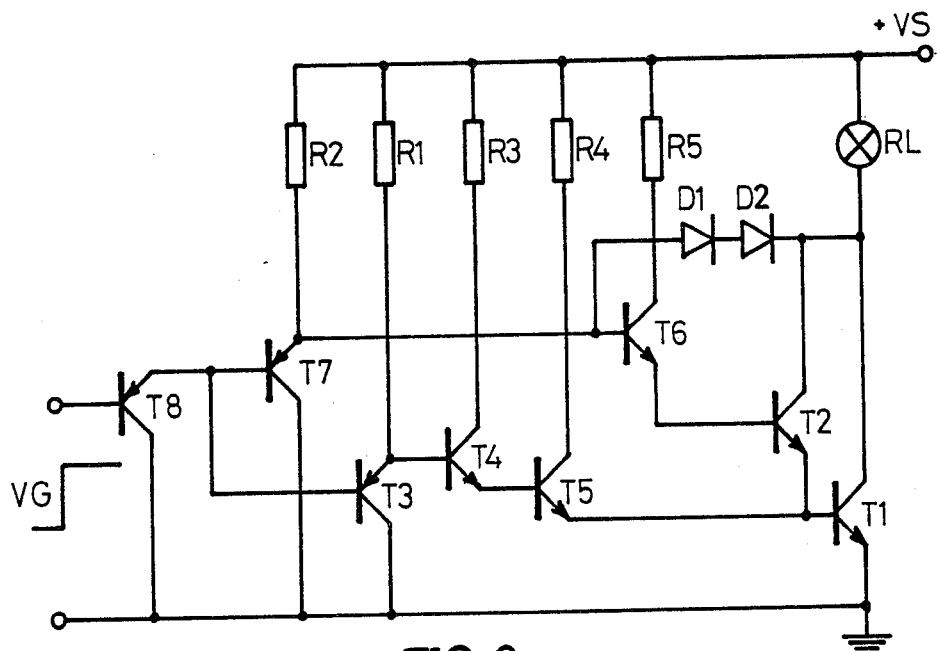
FIG. 2 is an actual circuit in the embodiment of this invention.

In FIG. 2, where the elements that are identical to those shown in FIG. 1 are indicated by the same symbol, generator G1 is constituted by a circuit made up of a transistor T3 of the P-N-P type, with its collector grounded and its emitter connected to the positive supply pole +VS through a resistor R1 and two N-P-N type transistors T4 and T5 connected in cascade as current amplifiers; the emitter of T5 is connected to the base of T1 and the base of T4 is connected to the emitter of T3. The currents supplied by T4 and T5 are determined by resistors R3 and R4 inserted with series in the T4 and T5 collectors, respectively. Generator G2 is a circuit differing from G1 only in that instead of two amplifying transistors, it has only one, here indicated as T6, the current of which is determined by the resistor R5 which is in series with its collector. Naturally, the number of current amplifying transistors could differ from that indicated in the illustrated circuit, so long as the currents applied to T1 and T2 meet the conditions mentioned above with reference to FIG. 1. The P-N-P transistor of generator G2 is indicated as T7 and the corresponding emitter resistor as R2.

Diode D of FIG. 1 is replaced in the FIG. 2 circuit by two diodes D1 and D2, connected in series and facing in the same direction, with the anode of D1 connected to the base of T6. There are two diodes in this circuit to compensate for the drop in voltage across the T6 base-emitter junction. They have no set conditions to meet, as in the case of FIG. 1, since the cut-off of T2 is guaranteed by the cut-off of T6 as soon as the saturation threshold of T2 is reached.

The function of the two synchronous control switches S1 and S2 is implemented in FIG. 2 by a P-N-P transistor T8 with its collector grounded, its emitter being directly connected to the bases of T3 and T7 and its base being connected to a circuit (e.g. a logical circuit) not shown in the illustration, capable of generating a step voltage VG that is sufficient to cut-off transistor T8. The "high" and "low" levels of the voltage VG thus correspond to the "closed" and "open" conditions, respectively, of switches S1 and S2.

The device in FIG. 2 lends itself very well to being implemented by a monolithic integrated circuit, either with transistors T1 and T2 in the same integrated circuit or simply as an integrated circuit containing only the actual control circuit. In the latter case, a standard monolithic Darlington pair may be used to advantage for the T1,T2 pair.

We claim:

1. A switch and control circuit for a D. C. load requiring a turn-on current of a first magnitude and an operating current of a second lower magnitude, said switch arranged in series between said load and a supply voltage source and comprising a first output transistor of a first conductivity type and a second driver transistor of said first conductivity type, said transistors arranged in a Darlington configuration; said circuit comprising first and second current generators respectively connected to the bases of said first and second transistors and further comprising a switching means operatively respectively connected between said first and second current generators and said first and second transistor bases for simultaneously interrupting the flow of current from said current generators to their respective transistor bases;

said circuit still further comprising a unidirectional current flow means, arranged between the base and collector of said second transistor, said current flow means oriented so that current supplied by said second current generator may be shunted away from the base of said second transistor and wherein said current flow means is an open circuit to current flow when said second transistor is in its active region.

2. A switch and control circuit as in claim 1, wherein said current flow means comprises at least one semiconductor diode.

3. A switch and control circuit as in claims 1 or 2, wherein said second current generator comprises a current amplifier transistor of said first conductivity type having its emitter connected to the base of said second transistor and wherein said current flow means comprises two series connected diodes connected between the base of said current amplifier transistor and the collector of said second transistor.

* * * * *